United States Patent
Shih

(10) Patent No.: US 7,064,031 B2
(45) Date of Patent: Jun. 20, 2006

(54) METHOD FOR FORMING A SEMICONDUCTOR DEVICE

(75) Inventor: Chung-Chin Shih, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 74 days.

(21) Appl. No.: 10/793,762

(22) Filed: Mar. 8, 2004

(65) Prior Publication Data

US 2005/0196948 A1    Sep. 8, 2005

(51) Int. Cl.
*H01L 21/336* (2006.01)
*H01L 21/3205* (2006.01)
*H01L 21/4763* (2006.01)

(52) U.S. Cl. .................. 438/264; 438/267; 438/585

(58) Field of Classification Search ................ 438/264, 438/261, 257, 585, 591, 775, 778, 785, 267
See application file for complete search history.

(56) References Cited

U.S. PATENT DOCUMENTS

| | | | |
|---|---|---|---|
| 6,642,573 B1 * | 11/2003 | Halliyal et al. | 438/261 |
| 6,706,595 B1 * | 3/2004 | Yang et al. | 438/591 |
| 6,709,921 B1 * | 3/2004 | Yeh et al. | 438/267 |
| 6,709,928 B1 * | 3/2004 | Jenne et al. | 438/264 |
| 2005/0189582 A1 * | 9/2005 | Mikolajick | 438/591 |

* cited by examiner

*Primary Examiner*—Walter L. Lindsay, Jr.
(74) *Attorney, Agent, or Firm*—Genus Law Group, LLC

(57) ABSTRACT

A method for forming a semiconductor device by self-aligned is provided. The present method provides a substrate and a multilayer structure is formed thereon. A patterned first layer is formed on the multilayer structure, and a second layer is then formed on the patterned first layer and the multilayer structure. An etching step is performed to partially etch the second layer. A third layer is formed and then is partially removed. Another etching step etches the patterned first layer. The multilayer structure is etched to expose the substrate. The third layer is also etched. A gate layer is formed on the semiconductor device, wherein a plurality of implanted regions are formed inside the substrate not covered by the multilayer structure.

10 Claims, 11 Drawing Sheets

METHOD FOR FORMING A SEMICONDUCTOR DEVICE

BACKGROUND OF THE INVENTION

1. Field of the Invention

The present invention relates to a method for forming a semiconductor device, and more particularly to a method for forming a semiconductor device by self-aligned.

2. Description of the Prior Art

Carriers injected in a silicon-oxide-nitride-oxide-silicon device, SONOS device, or a metal-oxide-nitride-oxide-silicon device, MONOS device, can not be spread out due to the silicon nitride layer, SiN layer, locally trapping character. However, the locally trapping character is very sensitive to high temperature, the lateral charge movement is easy to happen to degrade data retention at a high temperature.

As shown in FIG. 1A, a semiconductor device includes a substrate 100, an oxide layer 102a, a nitride layer 102b, another oxide layer 102c, a plurality of implanted regions 108, i.e. drains and sources, and a gate layer 112. Carriers 103 are stored in the nitride layer 102b. Because the locally trapping character is very sensitive to high temperature, carriers 103 may be move to the region 103' which includes none of carriers 103 at the high temperature to lose data.

The carriers 103 prevent the different data from the mixing to each other, the channel length between two bits, i.e. two implanted regions 108, which cannot be too short to keep more space between carriers 103. The semiconductor device in the prior art includes another disadvantage. The position storing electrons inside the nitride layer 102b which is away from the implanted regions 108 than the position storing holes is. The different distance between the implanted regions 108 and the position storing electrons, and holes may increase the Vth for erasing data of cells after cycling.

According to the above description, it is necessary to develop a method to form semiconductor devices to overcome the disadvantages of the prior semiconductor devices.

SUMMARY OF THE INVENTION

In accordance with the present invention, a method is provided to substantially overcome the drawbacks of the above mentioned problems for forming semiconductor device.

Accordingly, it is one objective of the present invention to provide a method for forming a semiconductor device by self-aligned. The semiconductor device is formed which is not very sensitive to high temperature, thus, the data stored in the semiconductor device is retained very well.

It is another objective of the present invention to provide a method for forming a semiconductor device by self-aligned. The includes almost the same distance between the implanted regions, the position storing electrons, and holes, and the Vth for erasing data of cells almost maintains the same after cycling.

It is a objective of the present invention to provide a method for forming a semiconductor device by self-aligned. The present invention includes a thinner oxide layer is formed between the gate and the substrate, and the thickness of the semiconductor device of the present invention is thinner.

It is a further objective of the present invention to provide a method for forming a semiconductor device by self-aligned. The present invention disclosed that carries stored inside a multilayer structure is difficult to mix with the carries stored inside another multilayer, and the width between the multilayer structures became smaller. The size and the channel length of the semiconductor device are also smaller.

It is a further objective of the present invention to provide a method for forming a semiconductor device by self-aligned. Different order of the present method forms different kinds of semiconductor devices which includes different bit line loading and more or less space to adjust the cell performance.

It is a further objective of the present invention to provide a method for forming a semiconductor device by self-aligned. The present invention prevents the much oxide layer is to be lose from in the etching step.

In accordance with the present invention, a method for forming a semiconductor device by self-aligned is disclosed. The present method provides a substrate and a multilayer structure formed thereon. A patterned first layer is formed on the multilayer structure, and a second layer is then formed on the patterned first layer and the multilayer structure. An etching step is performed to etch the partial second layer. A third layer is formed and then is partially removed. Another etching step etches the patterned first layer. The multilayer structure is etched to expose the substrate. The third layer is also etched. A gate layer is formed on the semiconductor device, wherein a plurality of implanted regions is formed inside the substrate which is not covered by the multilayer structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

These preferred embodiments of the present invention are described in greater detail now. Nevertheless, it should be recognized that the present invention can be practiced in a wide range of other embodiments besides those explicitly described, and the scope of the present invention is expressly not limited except as specified in the accompanying claims.

Figure 1:
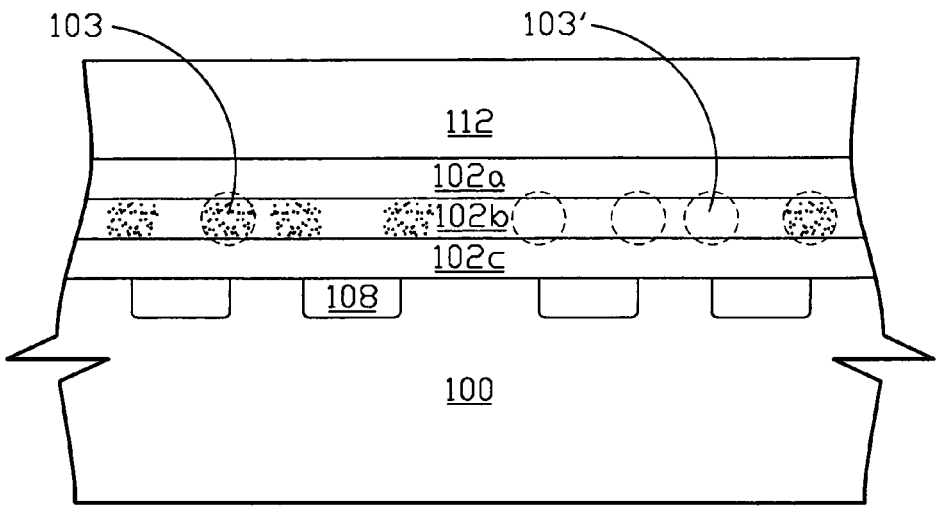
FIG. 1 illustrates a cross section of a semiconductor device in the prior art.
Figure 2A:
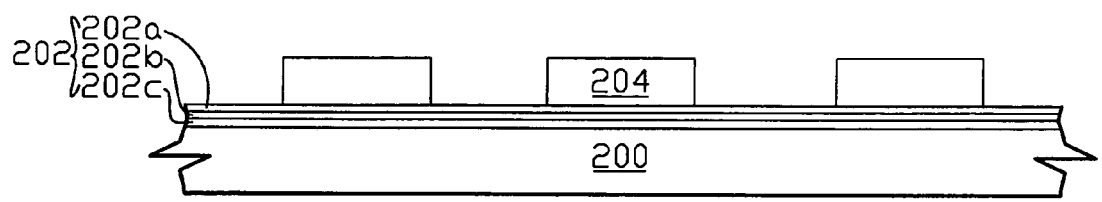
FIGS. 2A–2K illustrate cross sections of a method for forming a semiconductor device of the first embodiment of the present invention.
Figure 2B:
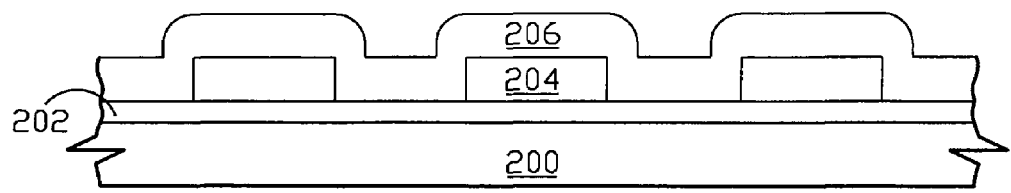

As illustrated in FIG. 2A, the first embodiment of the present invention provides a semiconductor device which includes a substrate 200 and a multilayer structure 202, wherein the multilayer structure 202 includes a first oxide layer 202a, a nitride layer 202b and a second oxide layer 202c. The nitride layer 202b is formed between the first oxide layer 202a and the second oxide layer 202c. A patterned first layer 204 is formed on the multilayer structure 202. A second layer 206 is formed on the patterned first layer 204 and the multilayer structure 202 as shown in FIG. 2B.

Figure 2C:
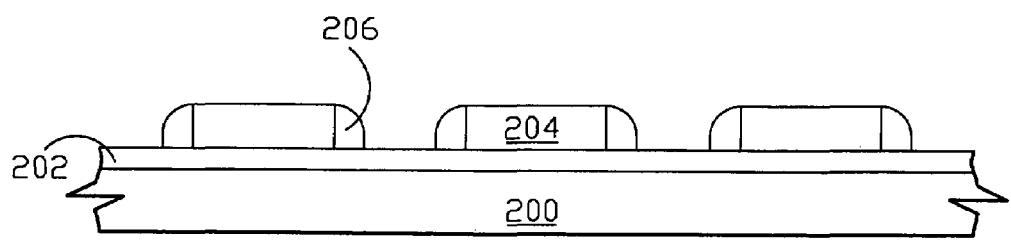
Figure 2D:
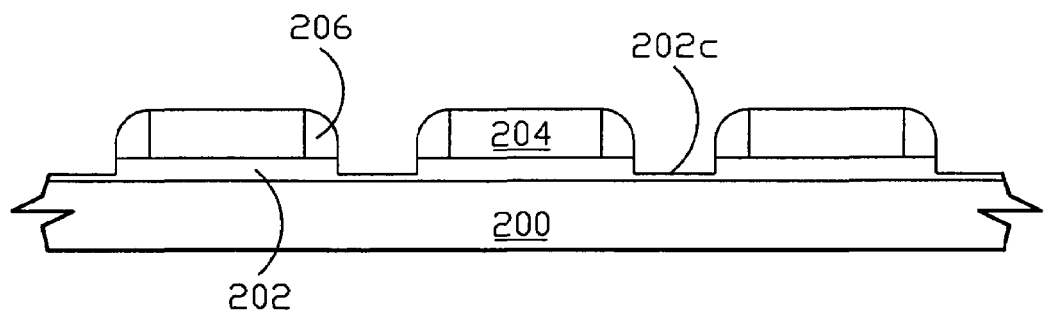
Figure 2E:
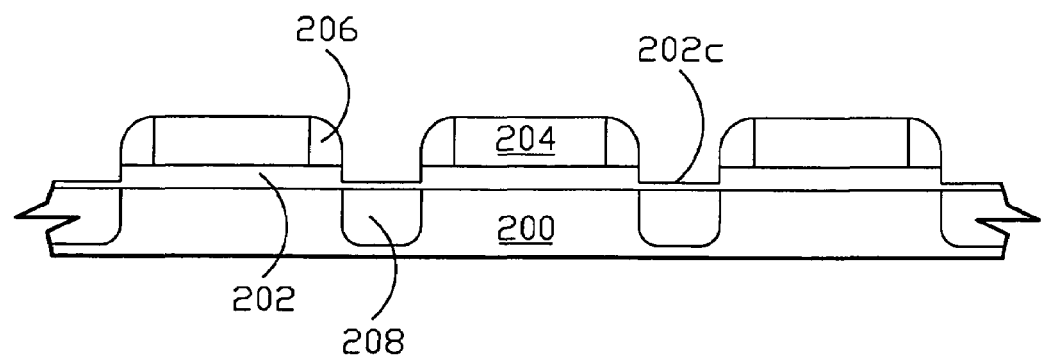
Figure 2F:
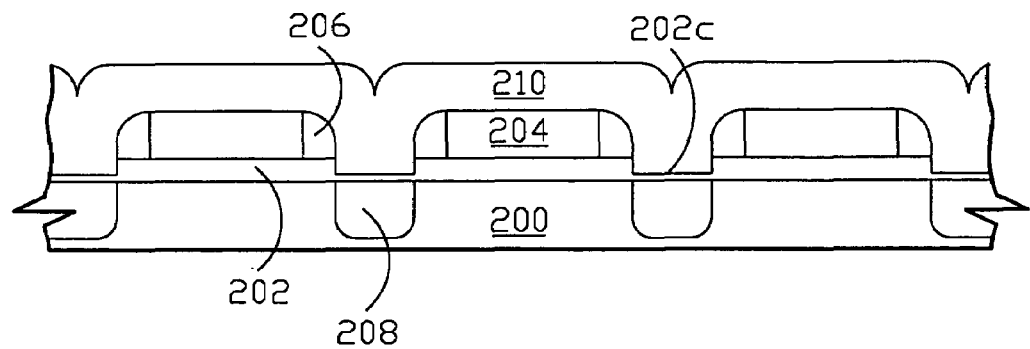
Figure 2G:
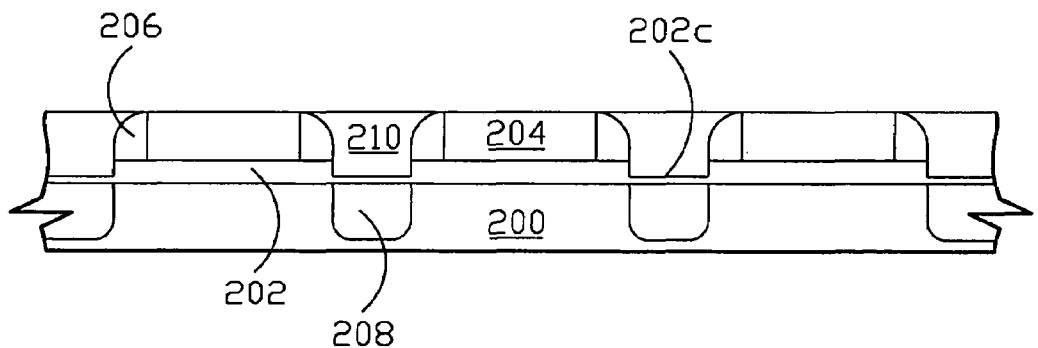
Figure 2H:
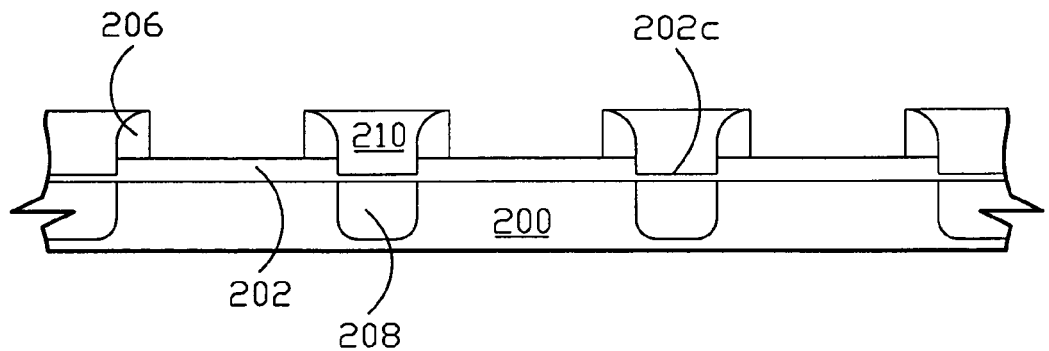
Figure 2I:
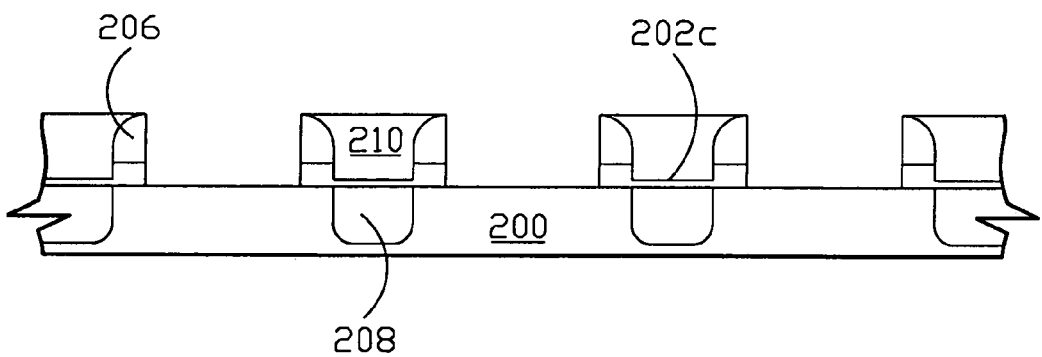
Figure 2J:
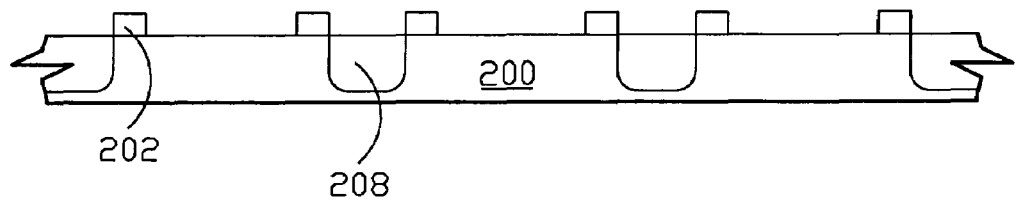
Figure 2K:
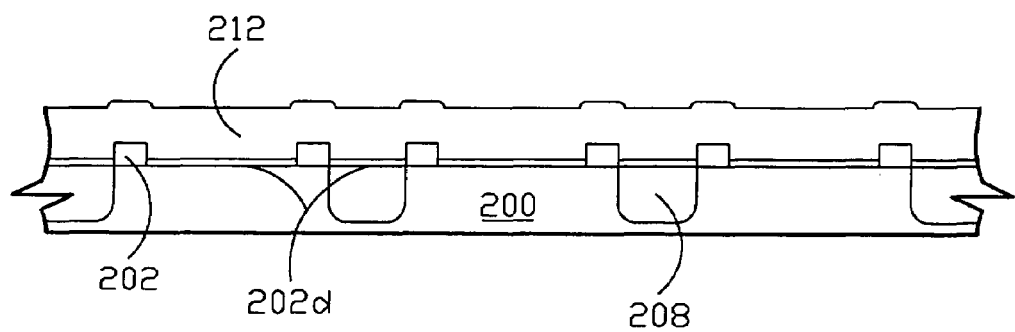

As shown in FIG. 2C, the second layer 206 is partially etched until a partial multilayer structure 202 is exposed. As shown in FIG. 2D, the multilayer structure 202 is partially etched, the first oxide layer 202a and the nitride layer 202b is etched and the second oxide layer 202c is maintained on the substrate 200. As shown in FIG. 2E, a plurality of implanted regions 208 are implanted inside the substrate 200 through the second oxide layer 202c. As shown in FIG. 2F, a third layer 210 is formed on the patterned first layer 204, the remained second layer 206 and the second oxide layer 202c. As shown in FIG. 2G, the third layer 210 is partially removed. As shown in FIG. 2H, the patterned first layer 204 is etched to expose partial multilayer structure 202. As shown in FIG. 2I, the exposed multilayer structure 202 is etched to expose the partial substrate 200. As shown in FIG. 2J, the remained third layer 210, the second oxide layer 202c and the remained second layer 206 is also etched to expose the remained multilayer structure 202 and the surface of the substrate 200 between the remained multilayer structure 202. As shown in FIG. 2K, a fourth layer 202d is formed on the exposed substrate 200. A gate layer 212 is then formed on the fourth layer 202d and the multilayer structure 202.

In the first embodiment of the present invention, the multilayer structure 202 is composed of two oxide layers 202a and 202c and the nitride layer 202b. The composition of the patterned first layer 204 is different from a composition of the second layer 206 the third layer 210. The patterned first layer 204 is a nitride layer. The second layer 206 is an oxide layer. The third layer 210 is an oxide layer. The fourth layer 202d is also an oxide layer. The gate layer 212 is composed of polysilicon. The third layer 210 is partially removed by chemical mechanical polishing, CMP.

The multilayer structure 202 stores charges to retain the data of each cell. Because the different charges stored in the different multilayer structure 202A which is difficult to move to each other, and the data of each cell can be retained well at high temperature. The forming method of the semiconductor device is less thermally sensitive. The distance between the implanted regions 208 and the position storing electrons and holes is almost the same, because the position storing the electrons and the holes inside the multilayer structure 202 is limited physically. The Vth for erasing data of cells almost maintains the same after cycling. The thickness of the semiconductor device of the present invention is thinner because the thicker multilayer structure 202 is replaced a thinner oxide layer 202d. Furthermore, the width between two multilayer structures 202 storing charges of the present semiconductor device can be less than the prior semiconductor device. The size of the present semiconductor device can be also smaller than the size of the prior semiconductor device. The minimum cell size of the semiconductor devices forming according to the present invention is about $4F^2$ and $2F^2$ per bit.

The gate of each cell of the present semiconductor device is formed inside the gate layer 212 that is not patterned yet. The implanted regions 208 are the regions for forming the bit lines, i.e. drains and sources of cells. As shown in FIG. 2C and FIG. 2D, the implanted regions 208 inside the exposed structure 200 are self-aligned by the patterned first layer 204 and the remained second layer 206 formed on the substrate 200. The patterned first layer 204 decides the resolution of cells of the semiconductor device. For example, the line width of the patterned first layer 204 decides the degree of the resolution of cells to be large or small. The present invention controls the width of each bit line and the channel length of two bit lines. The width of each bit line, i.e. each implanted region 208, and the channel length of two bit lines is decided by the patterned first layer 204 and the remained second layer 206.

The order of some steps of the method for forming a semiconductor device disclosed by the present invention can be changed. For example, the implanted regions 208 can be implanted before partially etching the multilayer structure 202 as shown in FIG. 2D. Some steps can be omitted. For example, the step of partially etching the multilayer structure 202, as shown in FIG. 2D, can be omitted. Hereafter, the multilayer structure 202 is formed under the third layer 210 and the multilayer structure 202 formed under the patterned first layer 204 can be etched in the same step such as the step shown in FIG. 2H. Moreover, the step for forming the fourth layer 202d may also be omitted if the second oxide layer 202c of the multilayer structure 202 is not etched.

Figure 3A:
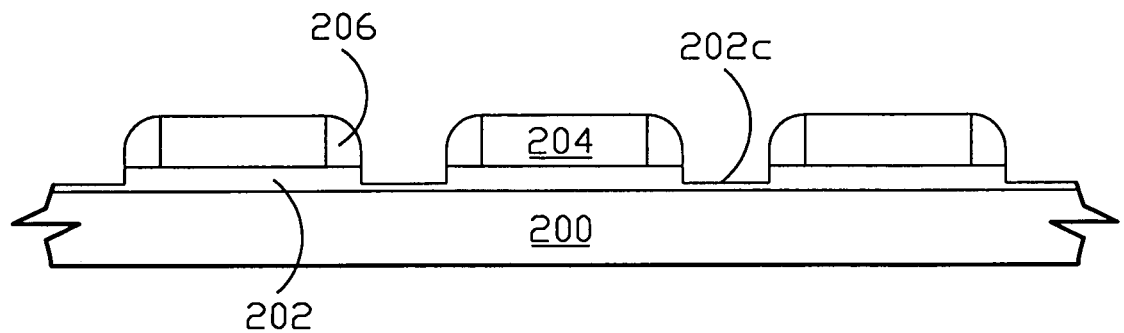
FIGS. 3A–3F illustrate cross sections of a method for forming a semiconductor device of the second embodiment of the present invention.
Figure 3B:
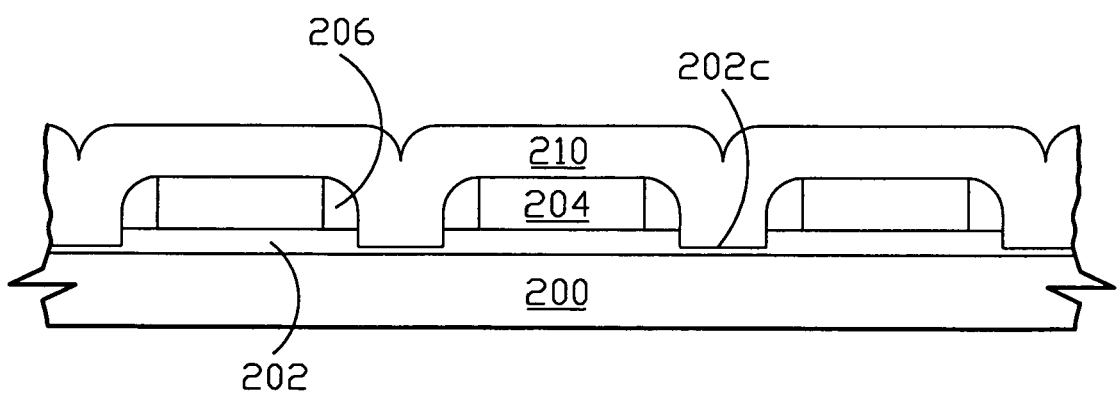
Figure 3C:
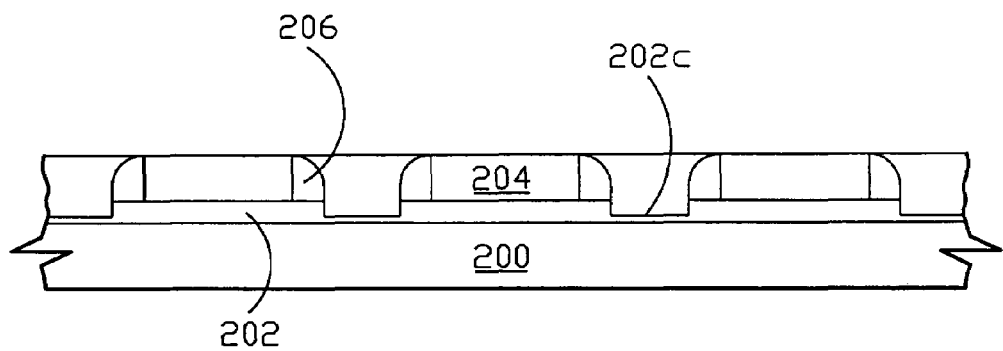
Figure 3D:
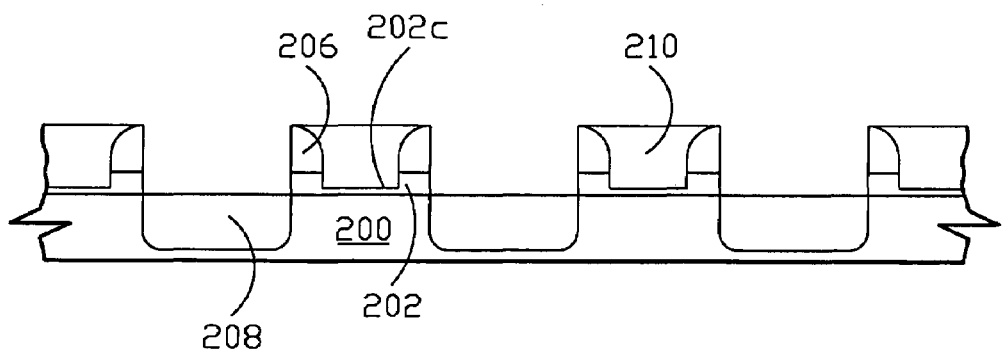
Figure 3E:
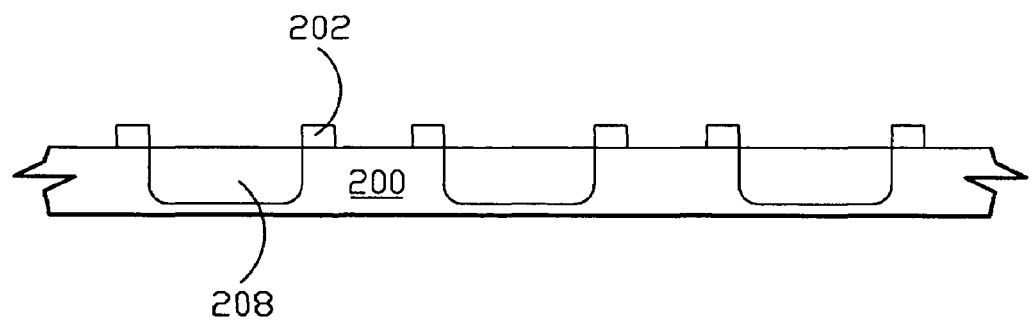
Figure 3F:
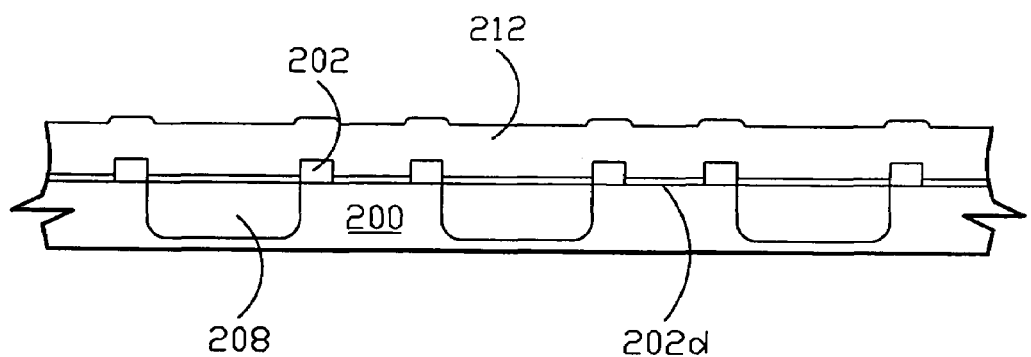

As shown in FIG. 3A, the second embodiment of the present invention provides a semiconductor device including a substrate 200, a multilayer structure 202, a second oxide layer 202c, a patterned first layer 204 and a remained second layer 206. As shown in FIG. 3B, a third layer 210 is formed on the patterned first layer 204, the remained second layer 206 and the second oxide layer 202c. As shown in FIG. 3C, the third layer 210 is partially removed. As shown in FIG. 3D, the patterned first layer 204 is etched to expose partial multilayer structure 202, and then the exposed multilayer structure 202 is etched to expose the partial substrate 200. A plurality of implanted regions 208 is formed inside the substrate 200 after the patterned first layer 204 is etched. The implanted regions 208 can be formed before etching the exposed multilayer structure 202 or after etching the exposed multilayer structure 202 in the second embodiment. As shown in FIG. 3E, the remained third layer 210, the second oxide layer 202c and the remained second layer 206 is etched to expose the remained multilayer structure 202 and the surface of the substrate 200 between the remained multilayer structure 202. As shown in FIG. 3F, a fourth layer 202d is formed on the exposed substrate 200. A gate layer 212 is then formed on the fourth layer 202d and the multilayer structure 202.

The first embodiment and the second embodiment of the present invention disclose the steps with different orders to form cells that having different channel length of semiconductor devices. The cell length of the cell is formed by the method of the first embodiment equals to the minimum resolution plus two widths of the patterned first layer 204, so that the bit line, i.e. the implanted region 208, of the cell of the first embodiment is narrower. The cell length and the width of the bit line, i.e. the implanted region 208, of the cells formed by the method of the second embodiment are both equal to the minimum resolution. The semiconductor device is formed by the different embodiment of the present invention that includes different advantages. For example, if the bit line loading of the cell of the semiconductor device is limited, the semiconductor device can be formed by the second embodiment of the present invention. If the semiconductor device needs more space to adjust the cell performance, and the semiconductor device can be formed by the first embodiment of the present invention.

Figure 4A:
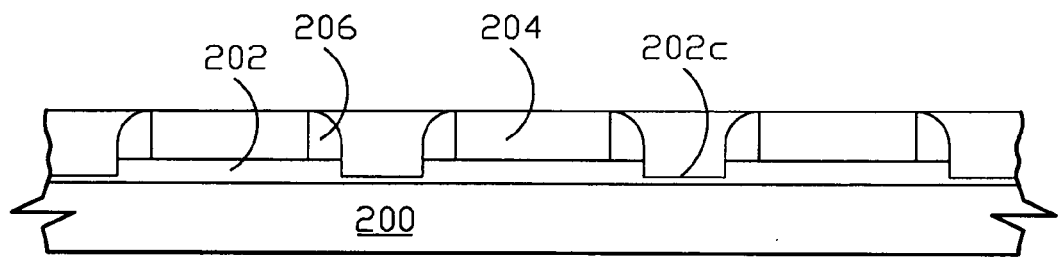
FIGS. 4A–4D illustrate cross sections of a method for forming a semiconductor device of the third embodiment of the present invention.
Figure 4B:
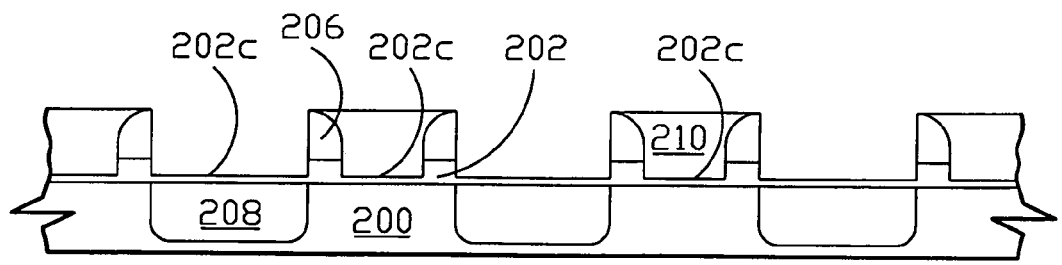
Figure 4C:
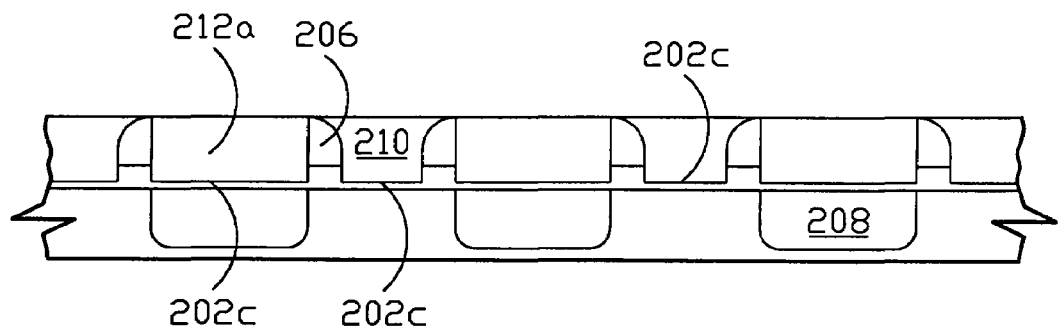
Figure 4D:
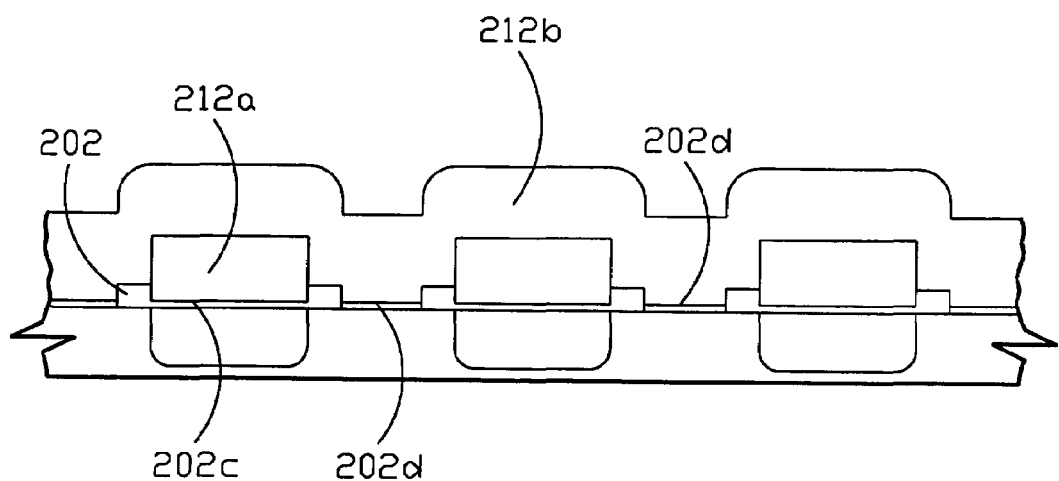

As shown in FIG. 4A, the third embodiment of the present invention includes a substrate 200, a multilayer structure 202, a second oxide layer 202c, a patterned first layer 204, a remained second layer 206 and a remained third layer 210. As shown in FIG. 4B, the patterned first layer 204 is etched to expose partial multilayer structure 202, and then the exposed multilayer structure 202 is partially etched to expose the second oxide layer 202c. A plurality of implanted regions 208 is formed inside the substrate 200 after the patterned first layer 204 is etched. Actually, the implanted regions 208 not only formed after exposing the second oxide layer 202c but also before exposing the second oxide layer 202c. As shown in FIG. 4C, a gate layer 212a is formed on the exposed second oxide layer 202c. As shown in FIG. 4D, the third layer 210 and the second oxide layer 202c is then etched to expose the partial substrate 200, and a fourth layer 202d is formed on the exposed substrate 200. Another gate layer 212b is formed on the fourth layer 202d and the gate layer 212a. The method disclosed by the third embodiment prevents the oxide layer from losing too much in the etching step.

The present invention provides a method to form a semiconductor device by self-aligned. The semiconductor device is not sensitive at the high temperature and the data is stored in each cell of the semiconductor device that is retained very well. The Vth for erasing data of cells almost maintains the same after cycling. The thickness of the semiconductor device of the present invention is thinner. The width between the multilayer structures is also smaller. The width of each bit line and the channel length of two bit lines of the present semiconductor device are better controllable. The size of the present semiconductor device is smaller. Different order of the present method forms different kinds of semiconductor devices that includes different bit line loading and more or less space to adjust the cell performance. Furthermore, the present invention also prevents the oxide layer from losing too much in the etching step.

Obviously, many modifications and variations of the present invention are possible in light of the above teachings. It is to be understood that within the scope of the appended claims, the present invention may be practiced other than as specifically described herein.

Although the specific embodiments have been illustrated and described, it will be obvious to those skilled in the art that various modifications may be made without departing from what is intended to be limited solely by the appended claims.

What is claimed is:

1. A method for forming a semiconductor device, comprising:
   providing a substrate and a multilayer structure thereon;
   forming a patterned first layer is made of nitride on said multilayer structure;
   forming a second layer on said patterned first layer and said multilayer structure;
   partially etching said second layer;
   forming a third layer;
   partially removing said third layer;
   etching said patterned first layer;
   etching said multilayer structure;
   etching said third layer;
   forming a gate layer;
   forming a fourth layer is made of oxide between said gate layer and said substrate; and
   wherein a plurality of implanted regions are formed inside said substrate not covered by said multilayer structure.

2. The method according to claim 1, wherein said implanted regions are formed after etching said patterned first layer.

3. The method according to claim 1, wherein said third layer is partially removed by chemical mechanical polishing.

4. The method according to claim 1, wherein said gate layer is a polysilicon layer.

5. The method according to claim 1, wherein said implanted regions are formed after partially etching said second layer.

6. The method according to claim 1, wherein said third layer is an oxide layer.

7. The method according to claim 1, wherein a composition of said patterned first layer is different from a composition of said second layer.

8. The method according to claim 1, wherein a composition of said first layer is different from a composition of said third layer.

9. The method according to claim 1, wherein said multilayer structure includes a first oxide layer, a nitride layer and a second oxide layer, and said nitride layer is formed between said first oxide layer and said second oxide layer.

10. The method according to claim 9, further comprising etching said first oxide layer and said nitride layer of said multilayer structure after partially etching said second layer.

* * * * *